(12) United States Patent
Sakai (10) Patent No.: US 11,659,735 B2
(45) Date of Patent: May 23, 2023

(54) SEMICONDUCTOR DEVICE AND DISPLAY DEVICE

(71) Applicant: Japan Display Inc., Tokyo (JP)

(72) Inventor: Takeshi Sakai, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 96 days.

(21) Appl. No.: 17/191,734

(22) Filed: Mar. 4, 2021

(65) Prior Publication Data

US 2021/0280653 A1   Sep. 9, 2021

(30) Foreign Application Priority Data

Mar. 5, 2020   (JP) .............................. JP2020-037720

(51) Int. Cl.
| | |
|---|---|
| H01L 27/00 | (2006.01) |
| H01L 29/00 | (2006.01) |
| H01L 27/32 | (2006.01) |
| G09G 3/32 | (2016.01) |
| H01L 27/12 | (2006.01) |
| H01L 29/786 | (2006.01) |
| H01L 29/423 | (2006.01) |

(52) U.S. Cl.
CPC .......... *H01L 27/3262* (2013.01); *G09G 3/32* (2013.01); *G09G 2310/0267* (2013.01); *H01L 27/1225* (2013.01); *H01L 27/1251* (2013.01); *H01L 29/42384* (2013.01); *H01L 29/7869* (2013.01); *H01L 29/78648* (2013.01); *H01L 29/78651* (2013.01); *H01L 2029/42388* (2013.01)

(58) Field of Classification Search
CPC ............ H01L 27/3258; H01L 27/3262; H01L 27/1225; H01L 27/1251; H01L 2029/42388; H01L 29/78696; H01L 29/42384; H01L 29/78651; H01L 29/78648; H01L 29/7869; G09G 3/32; G09G 3/3233; G09G 3/3266; G09G 3/3258; G09G 3/36; G09G 2310/0267

See application file for complete search history.

(56) References Cited

U.S. PATENT DOCUMENTS

| | | | |
|---|---|---|---|
| 8,823,074 B2 * | 9/2014 | Suzawa ............. | H01L 29/78696 438/266 |
| 10,269,831 B2 * | 4/2019 | Saitoh ................... | H01L 27/124 |
| 2009/0065771 A1 | 3/2009 | Iwasaki et al. | |

(Continued)

FOREIGN PATENT DOCUMENTS

JP   2007-250983 A   9/2007

*Primary Examiner* — Nikolay K Yushin
(74) *Attorney, Agent, or Firm* — Xsensus LLP (57) ABSTRACT

The semiconductor device includes a first gate electrode, a first gate insulating film, a semiconductor film, a first electrode, a second electrode, a second gate insulating film, and a second gate electrode. The first gate insulating film is located over the first gate electrode. The semiconductor film is located over the first gate insulating film and overlaps with the first gate electrode. The first electrode and the second electrode are each located over and in contact with the semiconductor film. The second gate insulating film is located over the first electrode and the second electrode. The second gate electrode is located over the second gate insulating film and overlaps with the second electrode and the first gate electrode. The first electrode is completely exposed from the second gate electrode.

20 Claims, 8 Drawing Sheets

(56) References Cited

U.S. PATENT DOCUMENTS

2014/0027767 A1\* 1/2014 Suzawa ................ H01L 27/108
                                                    257/296
2017/0162602 A1\* 6/2017 Saitoh .................... H01L 29/24
2021/0225960 A1\* 7/2021 Son ..................... H01L 27/3223

\* cited by examiner

SEMICONDUCTOR DEVICE AND DISPLAY DEVICE

CROSS-REFERENCE TO RELATED APPLICATION

This application is based upon and claims the benefit of priority from the prior Japanese Patent Application No. 2020-037720, filed on Mar. 5, 2020, the entire contents of which are incorporated herein by reference.

BACKGROUND OF THE INVENTION

Field of the Invention

An embodiment of the present invention relates to a semiconductor device or a display device including the semiconductor device.

Description of the Related Art

The Group 14 elements such as silicon and germanium have been widely used as a typical material exhibiting semiconductor properties for semiconductor devices exemplified by a thin film transistor. In recent years, findings of semiconductor properties in oxides, particularly oxides of the Group 13 elements such as indium and gallium have motivated tremendous research and development, which has led to the development of a thin film transistor having an oxide semiconductor in an active layer as disclosed in Japanese Patent Application No. 2007-250983.

BRIEF SUMMARY OF THE INVENTION

An embodiment of the present invention is a semiconductor device. The semiconductor device includes a first gate electrode, a first gate insulating film, a semiconductor film, a first electrode, a second electrode, a second gate insulating film, and a second gate electrode. The first gate insulating film is located over the first gate electrode. The semiconductor film is located over the first gate insulating film and overlaps with the first gate electrode. The first electrode and the second electrode are each located over and in contact with the semiconductor film. The second gate insulating film is located over the first electrode and the second electrode. The second gate electrode is located over the second gate insulating film and overlaps with the second electrode and the first gate electrode. The first electrode is completely exposed from the second gate electrode.

An embodiment of the present invention is a display device. The display device has a pixel, and the pixel includes a light-emitting element and a first transistor electrically connected to the light-emitting element. The first transistor includes a first gate electrode, a first gate insulating film, a first semiconductor film, a first electrode, a second electrode, a second gate insulating film, and a second gate electrode. The first gate insulating film is located over the first gate electrode. The first semiconductor film is located over the first gate insulating film and overlaps with the first gate electrode. The first electrode and the second electrode are each located over and in contact with the first semiconductor film. The second gate insulating film is located over the first electrode and the second electrode. The second gate electrode is located over the second gate insulating film and overlaps with the second electrode and the first gate electrode. The first electrode is completely exposed from the second gate electrode.

An embodiment of the present invention is a method for suppressing property deterioration of a semiconductor device. The semiconductor device for this method includes a first gate electrode, a first gate insulating film, a semiconductor film, a first electrode, a second electrode, a second gate insulating film, and a second gate electrode. The first gate insulating film is located over the first gate electrode. The semiconductor film is located over the first gate insulating film and overlaps with the first gate electrode. The first electrode and the second electrode are located over the semiconductor film. The second gate insulating film is located over the first electrode and the second electrode. The second gate electrode is located over the second gate insulating film and overlaps with the second electrode and the first gate electrode. The first electrode is completely exposed from the second gate electrode. The method includes independently controlling potentials respectively supplied to the first gate electrode and the second gate electrode.

DETAILED DESCRIPTION OF THE INVENTION

Hereinafter, each embodiment of the present invention is explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted.

In the present invention, when a plurality of films is formed by processing one film, the plurality of films may have functions or roles different from each other. However, the plurality of films originates from a film formed as the same layer in the same process and has the same layer structure and the same material. Therefore, the plurality of films is defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

In the specification and the claims, an expression "a structure is exposed from another structure" means a mode in which a part of the structure is not covered by the other structure and includes a mode where the part uncovered by the other structure is further covered by another structure.

First Embodiment

In the present embodiment, a structure of a semiconductor device 100 and a method for suppressing property deterioration of a semiconductor device according to an embodiment of the present invention are explained using FIG. 1A to FIG. 2B. The semiconductor device 100 is a so-called thin film transistor.

1. Fundamental Structure

Figure 1A:
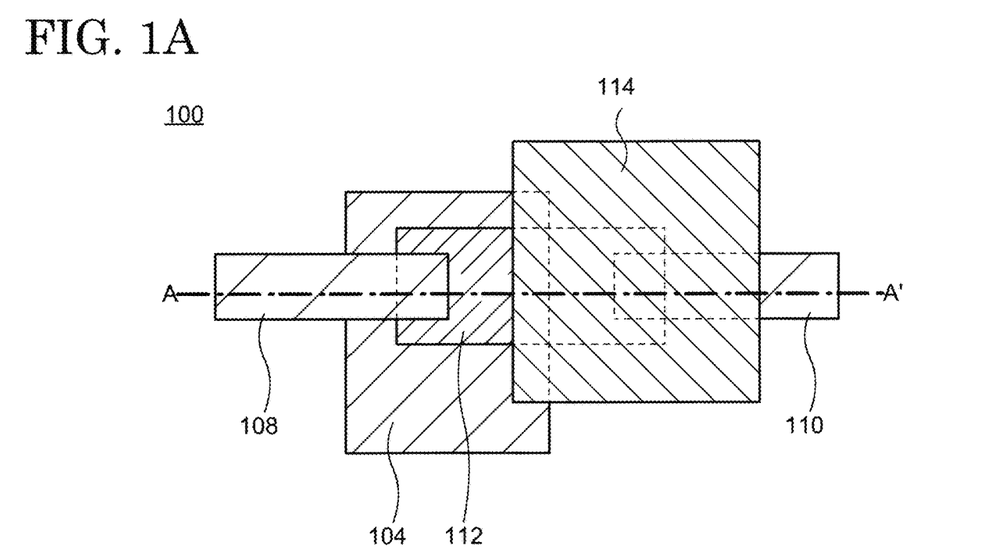
FIG. 1A is a schematic top view and FIG. 1B and FIG. 1C are schematic cross-sectional views of a semiconductor device according to an embodiment of the present invention.
Figure 1B:
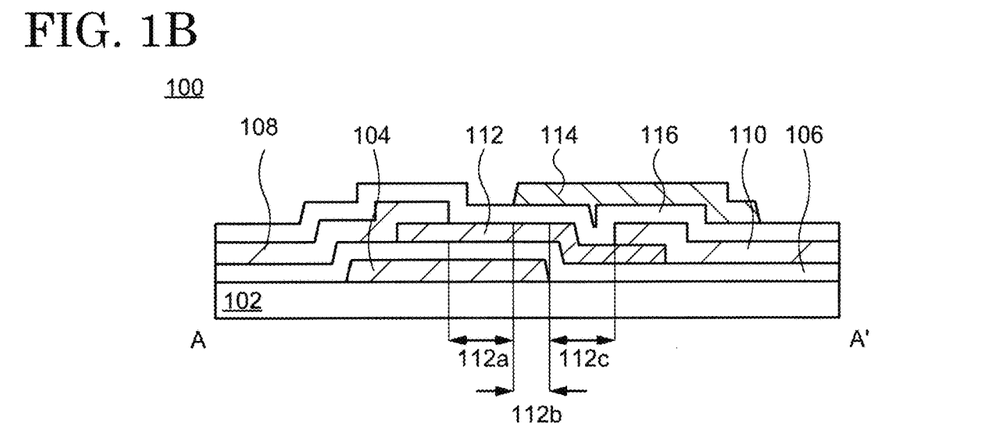

A schematic top view of the semiconductor device 100 is shown in FIG. 1A, and a schematic view of a cross section along a dotted to line A-A' in FIG. 1A is shown in FIG. 1B. The semiconductor device 100 is provided over a substrate 102 and includes a first gate electrode 104, a first gate insulating film 106, a semiconductor film 112, a first electrode 108, a second electrode 110, a second gate insulating film 116, and a second gate electrode 114 as fundamental elements. Although not illustrated, the semiconductor device 100 may also have a protection film over the second gage electrode 114.

1-1. First Gate Electrode

The first gate electrode 104 is formed over the substrate 102 so as to be in contact with the substrate 102 or through an undercoat which is not illustrated in the drawing and is configured to be supplied with a potential from an external circuit which is not illustrated in the drawing. When a potential is provided to the first gate electrode 104, electrical charges are accumulated at a vicinity of an interface between the semiconductor film 112 and the first insulating film 106. The first gate electrode 104 includes a metal such as titanium, molybdenum, tungsten, tantalum, copper, and aluminum or an alloy containing at least one metal selected from these metals and is configured to have a single-layer structure or a stacked-layer structure. The first gate electrode 104 is formed by applying a sputtering method, a chemical vapor deposition (CVD) method, or the like.

1-2. First Gate Insulating Film

The first gate insulating film 106 is disposed over and covers the first gate electrode 104. The first gate insulating film 106 may be composed of a single film or a stack of a plurality of films including a silicon-containing inorganic compound such as silicon nitride, silicon oxide, silicon oxynitride, and silicon nitride oxide. When the semiconductor film 112 contains an oxide semiconductor, it is preferred that a layer in contact with the semiconductor film 112 be a film containing silicon oxide. With this structure, it is possible to suppress the entrance of impurities such as hydrogen which may serve as a carrier-generating source into the semiconductor film 112 from the first gate insulating film 106. Accordingly, the generation of a level caused by impurities can be prevented in the semiconductor film 112. However, a so-called high-k material such as hafnium silicate, hafnium oxide, and yttrium oxide may be used as another inorganic compound. The first gate insulating film 106 is formed by utilizing a CVD method or a sputtering method.

Figure 1C:
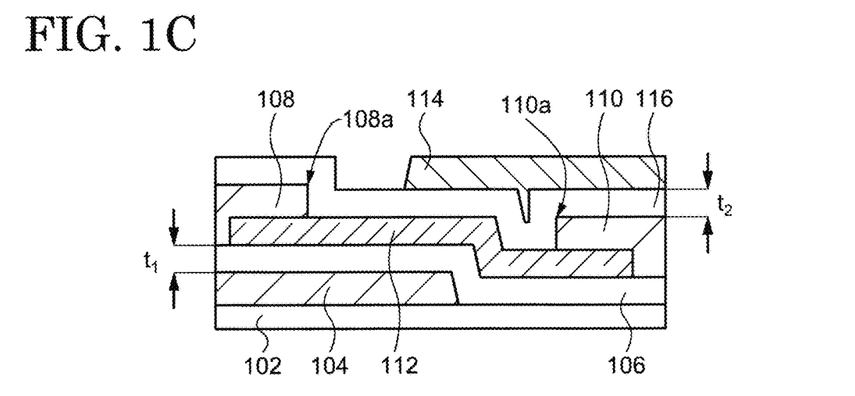

A thickness $t_1$ of the first gate insulating film 106 may be arbitrarily determined and may be appropriately selected from a range equal to or larger than 10 nm and equal to or smaller than 3000 nm, equal to or larger than 100 nm and equal to or smaller than 3000 nm, or equal to or larger than 300 nm and equal to or smaller than 2000 nm. Note that the thickness $t_1$ of the first gate insulating film 106 means a length of the first gate insulating film 106 in a vertical direction (i.e., a normal-line direction of the substrate 102) at an edge portion 108a of the first electrode 108 on a side of the second electrode 110 (see FIG. 10).

1-3. Semiconductor Film

The semiconductor film 112 is provided over the first gate insulating film 116 so that a portion thereof overlaps with the first gate electrode 104. In other words, a portion of the semiconductor film 112 does not overlap with the first gate electrode 104. A region of the semiconductor film 112 between the first electrode 108 and the second electrode 110 functions as an active region (channel). There is no limitation to a material included in the semiconductor film 112, and not only the Group 14 elements such as silicon and germanium but also an oxide semiconductor may be used. The oxide semiconductor may be selected from an oxide of the Group 13 elements such as iridium and gallium. The oxide semiconductor may contain a plurality of different Group 13 elements, and indium-gallium oxide (IGO) is represented as an example. The oxide semiconductor may further contain a Group 12 element. As a typical oxide semiconductor containing a Group 12 element, indium-gallium-zinc oxide (IGZO) is represented. The semiconductor film 112 may contain another element and may include a Group 14 element such as tin or a Group 4 element such as titanium and zirconium.

1-4. First Electrode and Second Electrode

The first electrode 108 and the second electrode 110 are each provided so as to be located over and overlap with the first gate insulating film 106 and the semiconductor film 112. The first electrode 108 and the second electrode 110 are in contact with the semiconductor film 112 by which electrical connection with the semiconductor film 112 is realized. A part of the first electrode 108 overlaps with the gate electrode 104. The second electrode 110 is formed so as not to overlap with the first gate electrode 104. Therefore, the first gate electrode 104 is completely exposed from the second electrode 110.

The first electrode 108 and the second electrode 110 may also contain the material usable for the first gate electrode 104 and have a single-layer structure of a stacked-layer structure. The first electrode 108 and the second electrode 110 may exist in the same layer by simultaneously forming both in the same process. In this case, the first electrode 108 and the second electrode 110 have the same layer structure, composition, and thickness. The first electrode 108 and the second electrode 110 are also formed by applying a sputtering method, a CVD method, or the like.

1-5. Second Gate Insulating Film

The second gate insulating film 116 is provided over the first electrode 108 and the second electrode 110 and covers at least a part of these electrodes. The second gate insulating film 116 may also include the material usable for the first gate insulating film 106 and is configured to have a single-layer structure or a stacked-layer structure. Similar to the first gate insulating film 106, it is preferred that a layer in contact with the semiconductor film 112 be a film containing silicon oxide when the semiconductor film 112 includes an oxide semiconductor. The second gate insulating film 116 is also formed by utilizing a CVD method or a sputtering method. The layer structures of the first gate insulating film 106 and the second gate insulating film 116 as well as the materials included therein may be the same as or different from each other.

A thickness $t_2$ of the second gate insulating film 116 may be also determined arbitrarily and may be appropriately selected from a range equal to or larger than 10 nm and equal to or smaller than 3000 nm, equal to or larger than 100 nm and equal to or smaller than 3000 nm, or equal to or larger than 300 nm and equal to or smaller than 2000 nm. Note that the thickness $t_2$ of the second gate insulating film 116 means a length of the second gate insulating film 116 in a vertical direction at an edge portion 110a of the second electrode 110 on a side of the first electrode 108 (see FIG. 10).

The thickness $t_1$ of the first gate insulating film 106 and the thickness $t_2$ of the second gate insulating film 116 may be the same as or substantially the same as each other or may be different from each other. For example, the former may be larger or smaller than the latter.

1-6. Second Gate Electrode

The second gate electrode 114 is formed over and in contact with the second gate insulating film 116. The second gate electrode 114 is also configured to be supplied with a potential from the external circuit which is not illustrated in the drawing. When a potential is supplied to the second gate electrode 114, electrical charges are accumulated at a vicinity of an interface between the semiconductor film 112 and the second gate insulating film 116. The second gate electrode 114 may be configured to be supplied with a potential different from that supplied to the first gate electrode 104 or may be configured to be supplied with the same potential as the first gate electrode 104 by electrically conducting with the first gate electrode 104 through an opening which is not illustrated in the drawing. The second gate electrode 114 may also include the material usable for the first gate electrode 104 and has a single-layer structure or a stacked-layer structure. The second gate electrode 114 is also formed by applying a sputtering method, a CVD method, or the like.

The second gate electrode 114 is provided so as to overlap with a part of the first gate electrode 104, a part of the semiconductor film 112, and at least a part of the second electrode 110. Hence, each of the first gate electrode 104 and the semiconductor film 112 is partly exposed from the second gate electrode 114. On the other hand, the second gate electrode 114 does not overlap with the first electrode 108. That is, the first electrode 108 is completely exposed from the second gate electrode 114.

The aforementioned arrangement with respect to the first gate electrode 104, the semiconductor film 112, the first electrode 108, the second electrode 110, and the second gate electrode 114 defines three regions (a first region 112a, a second region 112b, and a third region 112c) sandwiched by the first electrode 108 and the second electrode 110 in the semiconductor film 112 (FIG. 1B). The first region 112a is a region which overlaps with the first gate electrode 104 but does not overlap with the first electrode 108 nor the second gate electrode 114. The first region 112a is exposed from the first electrode 108 and the second gate electrode 114 between the first electrode 108 and the second electrode 110.

The third region 112c is spaced away from the first region 112a through the second region 112b. The third region 112c is a region which overlaps with the second gate electrode 114 but does not overlap with the second electrode 110 nor the first gate electrode 104. The third region 112c is exposed from the second electrode 110 between the first electrode 108 and the second electrode 110.

The second region 112b is sandwiched by the first region 112a and the third region 112c in a lateral direction (i.e., a direction parallel to a top surface of the substrate 102) and is a region sandwiched by the first gate electrode 104 and the second gate electrode 114 in the vertical direction. The second region 112b is in contact with the first region 112a and the third region 112c between the first electrode 108 and the second electrode 110. The first region 112a, second region 112b, and third region 112c of the semiconductor film 112 function as the channel of the semiconductor device 100.

Therefore, the semiconductor device 100 has a bottom-gate structure in the first region 112a and a top-gate structure in the third region 112c. On the other hand, a dual-gate structure having a pair of gate electrodes over and under the semiconductor film 112 is formed in the second region 112b. The conductivities of the first region 112a and the third region 112c are respectively controlled with the potentials supplied to the first gate electrode 104 and the second gate electrode 114. On the other hand, the conductivity of the second region 112b is controlled with both of the potentials supplied to the first gate electrode 104 and the second gate electrode 114.

2. Suppression of Property Deterioration

In the semiconductor device 100 having the aforementioned structure, it is possible to independently control the electric field on the side of the first electrode 108, i.e., the electrical field generated between the first gate electrode 104 and the first electrode 108 and the electric field on the side of the second electrode 110, i.e., the electric field generated between the second electrode 110 and the second gate electrode 114. For example, when the thickness $t_1$ of the first gate insulating film 106 and the thickness $t_2$ of the second gate insulating film 116 are the same as each other and the materials or permittivity thereof are the same as each other, the potentials supplied to the first gate electrode 104 and the second gate electrode 114 are independently controlled to supply different potentials to these electrodes. This method according to an embodiment of the present invention enables generation of the electrical fields different in intensity between the electrode and the gate electrode on the sides of the first electrode 108 and the second electrode 110. This ability contributes to suppression of property deterioration and improvement of reliability of the semiconductor device 100.

For instance, when the first electrode 108 and the second electrode 110 are respectively a source electrode and a drain electrode, the second electrode 100 is supplied with a periodically variable potential as a signal. Hence, when a current flows in the channel of the semiconductor film 112, deterioration readily proceeds particularly at the edge portion of the second electrode 110 serving as a drain electrode, resulting in a change in property of the semiconductor device 100. This behavior is called AC stress deterioration. In order to suppress the AC stress deterioration, an absolute value of the potential applied to the second gate electrode 114 located on the side of the second electrode 110 is adjusted to be lower than an absolute value of the potential applied to the first gate electrode 104 while providing the first gate electrode 104 and the second gate electrode 114 with the potentials required to turn on the channel. With this method, the electric field between the second gate electrode 114 and the second electrode 110 is relaxed. As a result, the AC stress deterioration at the edge portion of the second electrode 110 serving as a drain electrode can be suppressed without sacrificing the channel resistance.

On the contrary, when the first electrode 108 and the second electrode 110 are respectively a drain electrode and a source electrode, the first electrode 108 is supplied with a periodically variable potential as a signal. Thus, the AC stress deterioration becomes remarkable at the edge portion of the first electrode 108 serving as a drain electrode when a current flows in the channel of the semiconductor film 112. In this case, an absolute value of the potential applied to the first gate electrode 104 located on the side of the first electrode 108 is adjusted to be lower than an absolute value of the potential applied to the second gate electrode 114 while providing the first gate electrode 104 and the second gate electrode 114 with potentials required to turn on the channel. With this method, the electric field between the first gate electrode 104 and the first electrode 108 is relaxed. As a result, the AC stress deterioration at the edge portion of the first electrode 108 serving as a drain electrode can be suppressed without sacrificing the channel resistance.

The same is applied when a source electrode and a drain electrode are interchanged with each other. That is, it is possible to relax the drain-side electric field by lowering the absolute value of the potential of the gate electrode on the side of the electrode functioning as a drain electrode more than the absolute value of the potential of the gate electrode on the side of the electrode functioning as a source electrode. Accordingly, the AC stress deterioration is suppressed, and the reliability of the semiconductor device 100 can be improved.

Note that the AC stress deterioration may readily proceed in the case where the semiconductor film 112 includes an oxide semiconductor compared with the case where the semiconductor film 112 includes silicon. Therefore, the structure of the semiconductor device 100 according to the present embodiment may be more effective at suppressing the AC stress deterioration in the case where the semiconductor film 112 includes an oxide semiconductor.

The aforementioned structure of the semiconductor device 100 is also effective at suppressing the AC stress deterioration even in the case where the first gate electrode 104 and the second gate electrode 114 are simultaneously provided with the same potential. For instance, in the case where the first electrode 108 and the second electrode 110 respectively function as a source electrode and a drain electrode and the thicknesses $t_1$ and $t_2$ are the same as each other, it is possible to relax the drain-side electric field by forming the first gate insulating film 106 and the second gate insulating film 116 so that the permittivity of the latter is smaller than that of the former. On the contrary, in the case where the first electrode 108 and the second electrode 110 respectively function as a drain electrode and a source electrode and the thicknesses $t_1$ and $t_2$ are the same as each other, the first gate insulating film 106 and the second gate insulating film 116 may be fabricated so that the permittivity of the former is smaller than that of the latter.

Figure 2A:
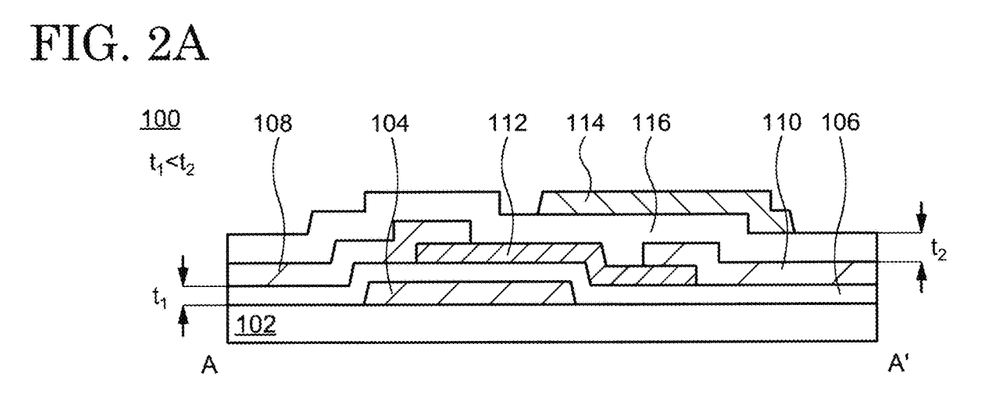
FIG. 2A and FIG. 2B are schematic cross-sectional views of a semiconductor device according to an embodiment of the present invention.

In the case where the materials included in the first gate insulating film 106 and the second gate insulating film 116 are the same as each other and the first gate electrode 104 and the second gate electrode 114 are simultaneously provided with the same potential, the electric field on the drain side can be also relaxed by independently controlling the thickness $t_1$ of the first gate insulating film 106 and the thickness $t_2$ of the second gate insulating film 116. Specifically, when the first electrode 108 and the second electrode 110 respectively function as a source electrode and a drain electrode, the semiconductor device 100 is structured so that the thickness $t_2$ of the second gate insulating film 116 is larger than the thickness $t_1$ of the first gate insulating film 106 as shown in FIG. 2A. For example, the thickness $t_1$ is selected from a range equal to or larger than 10 nm and equal to or smaller than 1000 nm, equal to or larger than 100 nm and equal to or smaller than 1000 nm, or equal to or larger than 300 nm and equal to or smaller than 700 nm, while the thickness $t_2$ is selected from a range equal to or larger than 50 nm and equal to or smaller than 3000 nm, equal to or larger than 500 nm and equal to or smaller than 2000 nm, or equal to or larger than 1000 nm and equal or smaller than 1500 nm. This method allows the electric field between the second electrode 110 functioning as a drain electrode and the second gate electrode 114 to be relaxed, thereby suppressing the AC stress deterioration at the edge portion of the second electrode 110.

Figure 2B:
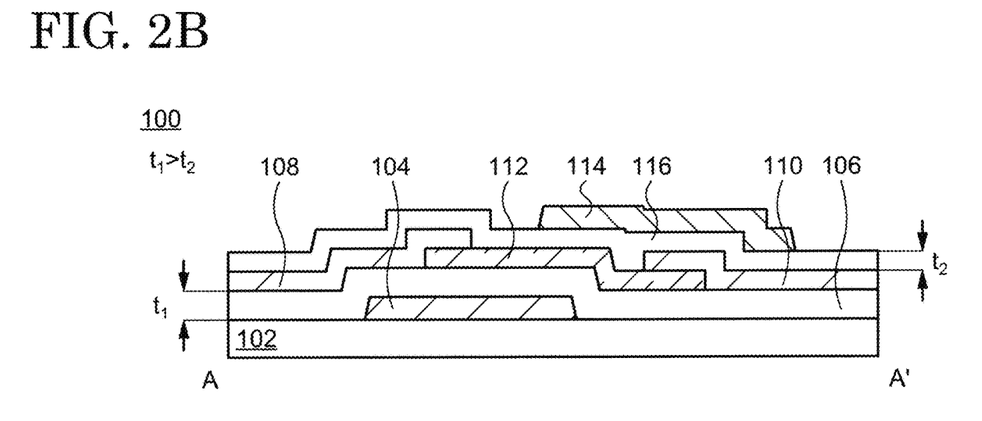

On the contrary, when the first electrode 108 and the second electrode 110 respectively function as a drain electrode and a source electrode, the semiconductor device 100 is structured so that the thickness $t_2$ of the second gate insulating film 116 is smaller than the thickness $t_1$ of the first gate insulating film 106 as shown in FIG. 2B. For example, the thickness $t_1$ is selected from a range equal to or larger than 50 nm and equal to or smaller than 3000 nm, equal to or larger than 500 nm and equal to or smaller than 2000 nm, or equal to or larger than 1000 nm and equal to or smaller than 1500 nm, while the thickness $t_2$ is selected from a range equal to or larger than 10 nm and equal to or smaller than 1000 nm, equal to or larger than 100 nm and equal to or smaller than 1000 nm, or equal to or larger than 300 nm and equal to or smaller than 700 nm. This method allows the electric field between the first electrode 108 functioning as a drain electrode and the first gate electrode 104 to be relaxed, thereby suppressing the AC stress deterioration at the edge portion of the first electrode 108.

As described above, the intensities of the electric field between the first electrode 108 and the first gate electrode 104 and the electric field between the second electrode 110 and the second gate electrode 114 can be independently controlled in the semiconductor device 100 according to the present embodiment. Hence, it is possible to effectively suppress the AC stress deterioration, particularly the AC stress deterioration on the side of the electrode functioning as a drain electrode. As a result, a semiconductor device with high reliability can be produced. In addition, the property deterioration of the semiconductor device 100 can be suppressed by the controlling method of property deterioration according to the present embodiment.

Second Embodiment

In the present embodiment, a structure of a display device 120 having light-emitting elements is explained as an example of an electric device including the semiconductor device 100. An explanation of the structures the same as or similar to those described in the First Embodiment may be omitted.

1. Outline Structure

Figure 3:
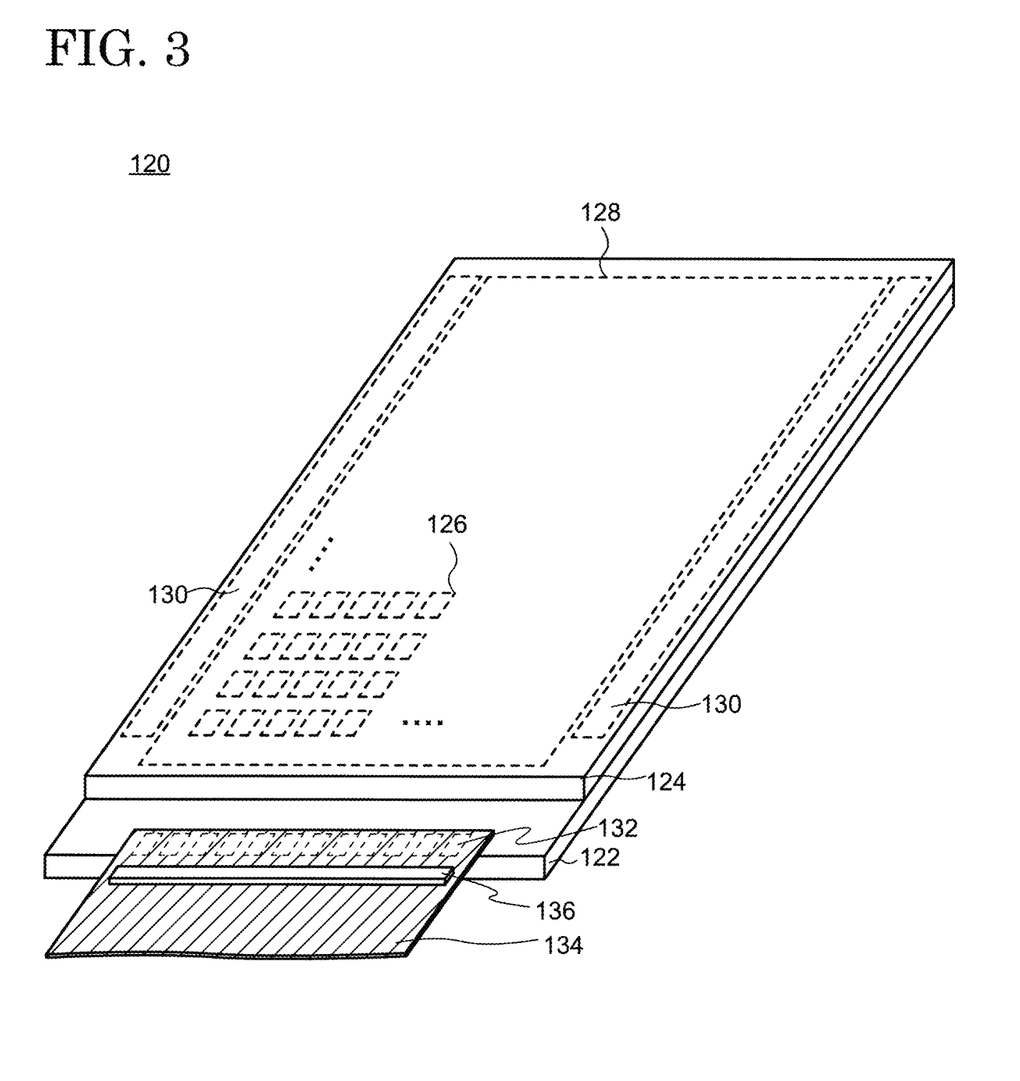
FIG. 3 is a schematic perspective view of a display device according to an embodiment of the present invention.

A schematic perspective view of the display device 120 is shown in FIG. 3. The display device 120 has a substrate 122 and a counter substrate 124 opposing the substrate 122, and a plurality of pixels 126 is provided to the substrate 122. A region in which the plurality of pixels 126 is arranged is a display region 128, and scanning-line driver circuits 130 for controlling the pixels 126 are formed in the outer side of the display region 128 (peripheral region) over the substrate 122. The counter substrate 124 is disposed over the pixels 126 and the scanning-line driver circuits 130 to protect these elements. Wirings which are not illustrated in the drawing extend from the display region 128 and the scanning-line driver circuits 130 to a side of the substrate 122 and are exposed at an edge portion of the substrate 122 to form terminals 132. The terminals 132 are electrically connected to a flexible printed circuit substrate (FPC) 134, and a driver IC 136 for controlling the pixels 126 may be mounted over the FPC 134. Note that the driver IC 136 may not be disposed over the FPC 134 but may be mounted over the substrate 122. A signal-line driver circuit may be formed over the substrate 122 instead or together with the driver IC 136. Here, the substrate 122 corresponds to the substrate 102 of the First Embodiment.

2. Structure of Pixel

The light-emitting element and a pixel circuit for controlling the light-emitting element are provided in each pixel 126. The pixel circuit includes a variety of elements such as a transistor and a capacitor element and is controlled with signals supplied from an external circuit (not illustrated in the drawing) through the scanning-line driver circuits 130, the driver IC 136, and/or the signal-line driver circuit. The light emission obtained from the light-emitting element is controlled with the pixel circuit, by which an image is displayed on the display region 128. Although the structure of the pixel circuit is arbitrarily determined, at least one semiconductor device 100 described in the First Embodiment is provided in each pixel circuit.

Figure 4:
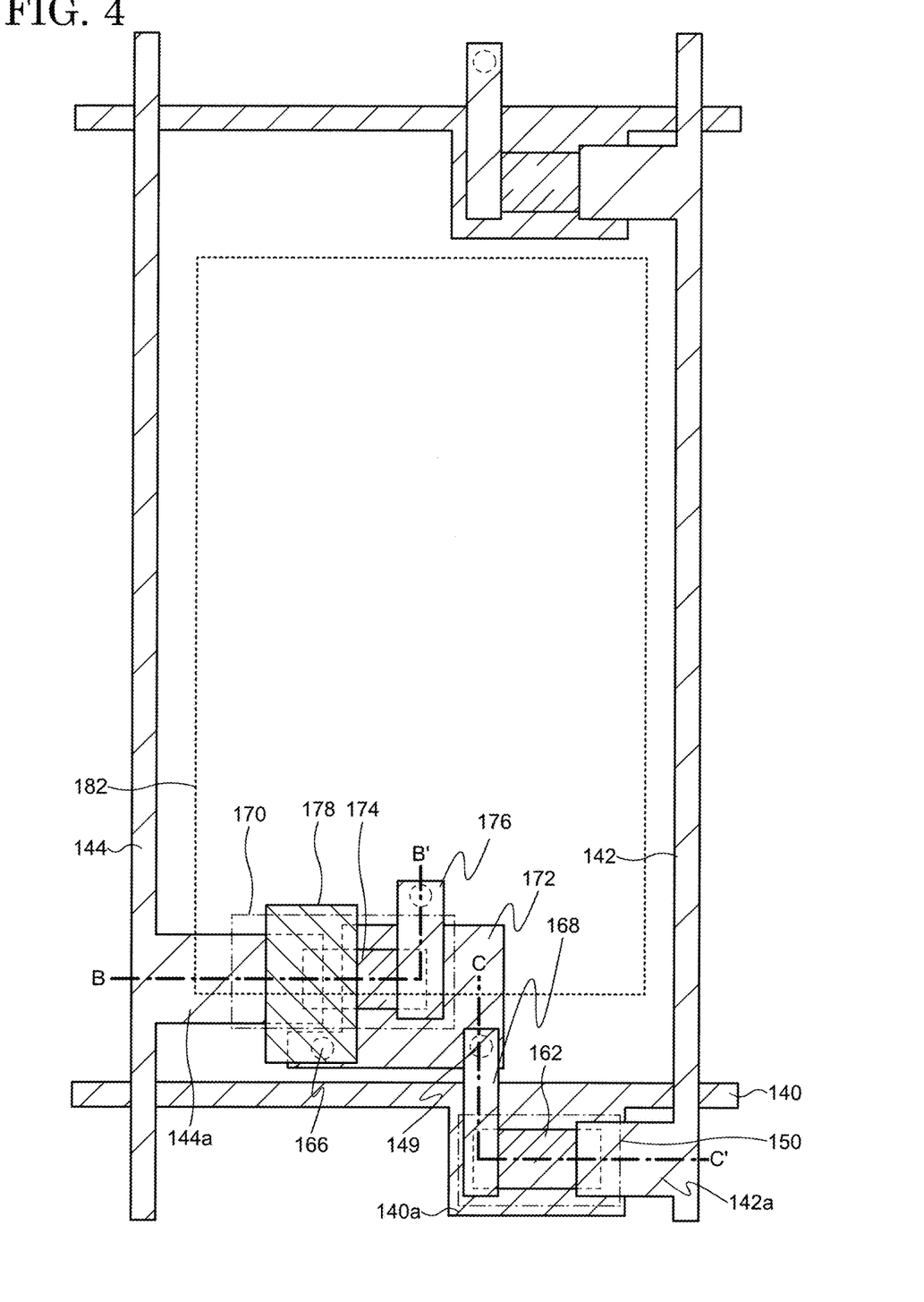
FIG. 4 is a schematic top view of a pixel of a display device according to an embodiment of the present invention.
Figure 5:
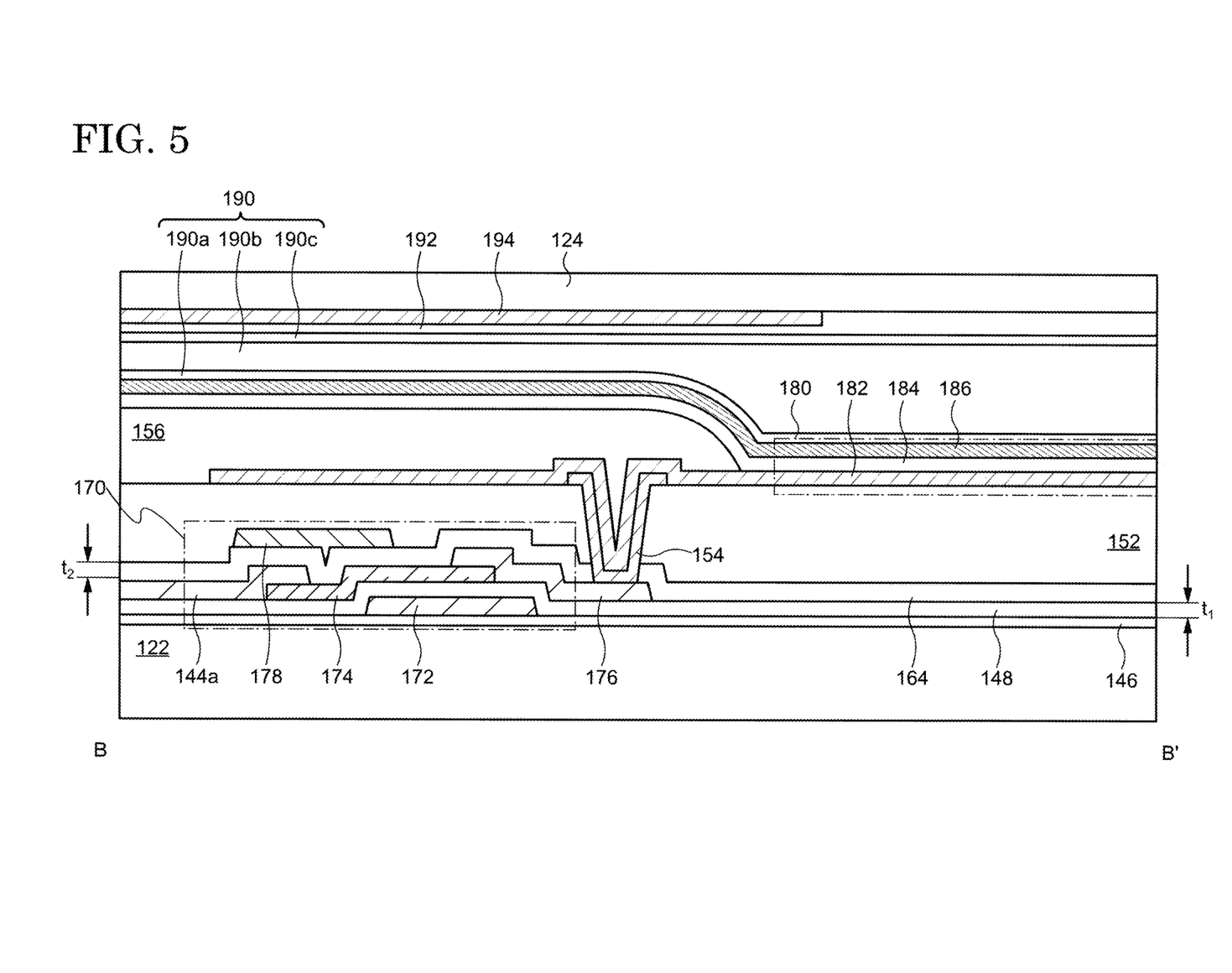
FIG. 5 is a schematic cross-sectional view of a display device according to an embodiment of the present invention.
Figure 6:
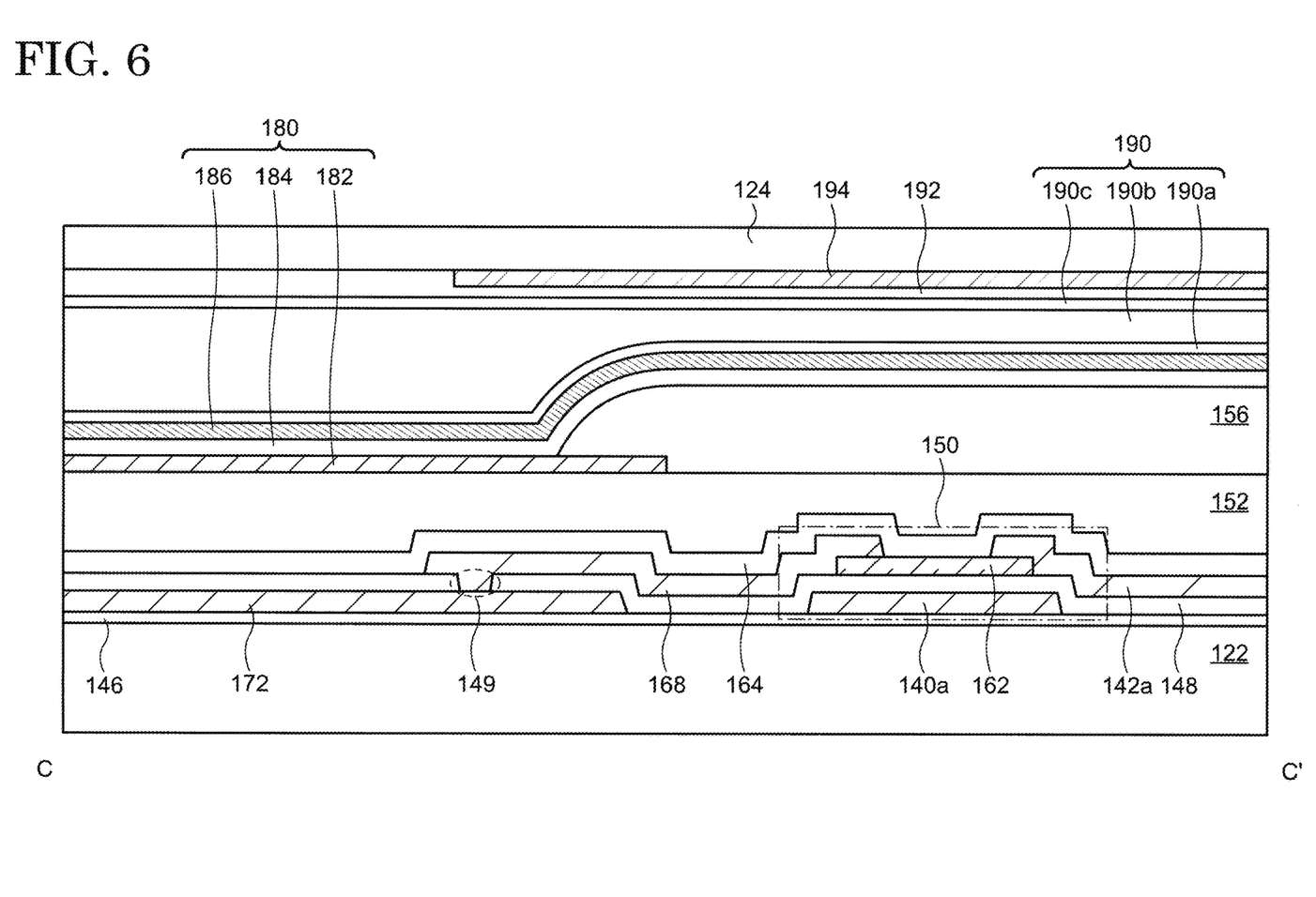
FIG. 6 is a schematic cross-sectional view of a display device according to an embodiment of the present invention.

A schematic top view of the pixel 126 is shown in FIG. 4. FIG. 5 and FIG. 6 are respectively schematic views of cross sections along the dotted lines B-B' and C-C' in FIG. 4. In these drawings, an example is demonstrated where two transistors 150 and 170 are disposed in one pixel 126. However, the structure of the pixel 126 may be arbitrarily determined. Hence, three or more transistors may be provided in each pixel 126, and one or a plurality of elements other than a transistor (capacitor element or the like) may be disposed. In the following example, the transistor 170 corresponds to the semiconductor device 100 of the First Embodiment. However, the semiconductor device 100 may be used as the transistor 150.

Gate wirings 140 extending from the scanning-line driver circuits 130 as well as signal lines 142 and current-supplying lines 144 extending from the driver IC 136 or the signal-line driver circuit are provided over the substrate 122. Each pixel 126 is connected to the gate wiring 140, the signal line 142, and the current-supplying line 144. The signal line 142 is provided with an initializing signal for initializing the transistor 150 and an image signal corresponding to gradation data required to display an image. The gate wiring 140 is periodically provided with a gate potential which is a constant potential, while the current-supplying line 144 is constantly supplied with a constant potential.

The transistors 150 and 170 are formed over the substrate 122 through an undercoat 146 which is an optional element. The substrate 122 may include glass, quartz, or a polymer such as a polyimide and a polycarbonate. Similar to the first gate insulating film 106 and the second gate insulating film 164, the undercoat 146 may be composed of a single film or a plurality of stacked films including a silicon-containing inorganic compound, for example.

The transistor 170 has a first gate electrode 172, a first gate insulating film 148 covering the first gate electrode 172, and a first semiconductor film 174 overlapping with the first gate electrode 172 through the first gate insulating film 148. The transistor 170 further includes a first electrode 176 and a second electrode 144a which are located over, in contact with, and overlap with the first gate insulating film 148 and the first semiconductor film 174. A part of the first electrode 176 may overlap with the first gate electrode 172. Note that the second electrode 144a is a part of the current-supplying line 144 and is illustrated as a portion protruding rightward from the current-supplying line 144 in FIG. 4.

The transistor 170 further includes a second gate insulating film 164 formed over the first electrode 176 and the second electrode 144a and covering at least a part of these electrodes. In the present embodiment, the second gate insulating film 164 is fabricated so that a thickness $t_2$ thereof is larger than a thickness $t_1$ of the first gate insulating film 148. The transistor 170 further includes a second gate electrode 178 over and in contact with the gate insulating film 164. The second gate electrode 178 is provided so as to overlap with a part of the first gate electrode 172, a part of the first semiconductor film 174, and at least a part of the second electrode 144a. Hence, a part of the first gate electrode 172 and a part of the first semiconductor film 174 are each exposed from the second gate electrode 178. On the other hand, the second gate electrode 178 does not overlap with the first electrode 176. That is, the whole of the first electrode 176 is exposed from the second gate electrode 178.

The first gate electrode 172, the first gate insulating film 148, the first semiconductor film 174, the first electrode 176, the second electrode 144a, the second gate insulating film 164, and the second gate electrode 178 respectively correspond to the first gate electrode 104, the first gate insulating film 106, the semiconductor film 112, the first electrode 108, the second electrode 110, the second gate insulating film 116, and the second gate electrode 114 of the semiconductor device 100 demonstrated in FIG. 2A. Hence, the arrangement with respect to the first gate electrode 172, the first gate insulating film 148, the first semiconductor film 174, the first electrode 176, the second electrode 144a, the second gate insulating film 164, and the second gate electrode 178 is the same as that of the semiconductor device 100.

The transistor 150 is structured by a third gate electrode 140a, the first gate insulating film 148 covering the third gate electrode 140a, a second semiconductor film 162 overlapping with the third gate electrode 140a through the first gate insulating film 148, and a first electrode 142a and a second electrode 168 over and electrically connected to the second semiconductor film 162 (FIG. 6). The transistor 150 is covered by the second gate insulating film 164. The third gate electrode 140a is a part of the gate wiring 140 and is illustrated as a portion protruding downward in FIG. 4. Similarly, the first electrode 142a is also a part of the signal line 142 and is illustrated as a portion protruding leftward in FIG. 4. Note that the structure of the transistor 150 is not limited to the structure described above, and the transistor 150 may further include, for example, a channel protection film located over the second semiconductor film 162 and partly covered by the first electrode 142a and the second electrode 168 although not illustrated in the drawing. The transistor 150 may be a top-gate type transistor or a dual-gate type transistor. Alternatively, the transistor 150 may have the structure of the semiconductor device 100. In addition, the second semiconductor film 162 of the transistor 150 may include silicon or an oxide semiconductor.

In the example shown here, the first gate electrode 172 and the second gate electrode 178 of the transistor 170 are electrically conducted to each other through an opening 166 (see FIG. 4) formed in the first gate insulating film 148 and the second gate insulating film 164. Hence, these electrodes are in equipotential. The second electrode 168 of the transistor 150 is electrically connected to the first gate electrode 172 of the transistor 170 through an opening 149 formed in the first gate insulating film 148 (see FIG. 6). This structure allows the potentials based on the signals (image signal and initializing signal) provided from the signal line 142 to the transistor 150 to be provided to the first gate electrode 172, by which the transistor 170 is controlled. The potentials based on the image signal and the initializing signal are simultaneously provided to the first gate electrode 172 and the second gate electrode 178 because the first gate electrode 172 is equipotential with the second gate electrode 178.

A leveling film 152 for absorbing depressions and projections caused by the transistors 150 and 170 and for providing a flat surface is disposed thereover, and the light-emitting element 180 is arranged over the leveling film 152. The light-emitting element 180 has a pixel electrode 182, an electroluminescence layer 184, and a counter electrode 186 as a fundamental structure. An edge portion of the pixel electrode 182 is covered with a partition wall 156. The leveling film 152 and the partition wall 156 are formed with a polymer material such as an epoxy resin, an acrylic resin, a polyimide, and a polysiloxane.

The structure of the electroluminescence layer 184 may be arbitrarily selected, and the electroluminescence layer 184 may be structured with one or a plurality of functional layers each composed of an organic material and/or an inorganic material. As a functional layer, a charge-injection layer, a charge-transporting layer, an emission layer, a charge-blocking layer, an exciton-blocking layer, and the like are represented. The electroluminescence layer 184 is configured to be respectively supplied with holes and electrons from the pixel electrode 182 and the counter electrode 186 when the pixel electrode 182 and the counter electrode 186 are allowed to respectively function as an anode and a cathode. With respect to the pixel electrode 182 and the counter electrode 186, the known materials and structures may be applied, and the light emission from the electroluminescence layer 184 can be utilized by structuring one of the electrodes as a reflective electrode and the other as a light-extracting electrode.

The pixel electrode 182 is electrically connected to the first electrode 176 of the transistor 170 through a connection electrode 154 which is an optional element. Hence, the second electrode 144a is connected to the light-emitting element 180 through the first electrode 176. This structure allows the potential supplied to the current-supplying line 144 to be provided to the pixel electrode 182 through the second electrode 144a, the first semiconductor film 174, and the first electrode 176 while the transistor 177 is on. The counter electrode 186 is provided with a constant potential lower than the potential supplied to the current-supplying line 144. When the potential difference between the pixel electrode 182 and the counter electrode 186 exceeds the threshold value of the electroluminescence layer 184, a current flows from the pixel electrode 182 to the electroluminescence layer 184, by which carrier recombination occurs in the electroluminescence layer 184, resulting in light emission. Hence, the first electrode 176 and the second electrode 144a respectively function as a drain electrode and a source electrode in the present embodiment.

As an optional element, a sealing film 190 may be disposed between the light-emitting element 180 and the counter substrate 124 (FIG. 5, FIG. 6). The structure of the sealing film 190 is also arbitrary, and the sealing film 190 may be structured by applying the known materials and structures. For example, stacked films in which an organic film 190b including a polymer material such as an epoxy resin is sandwiched by inorganic films 190a and 190c including a silicon-containing inorganic compound may be employed as the sealing film 190. Moreover, the counter substrate 124 may be provided with a light-shielding film 194 covering the transistors 150 and 170, the gate wirings 140, the signal lines 142, and the current-supplying lines 144 as well as an overcoat 192 covering the light-shielding film 194 and a color filter (not illustrated in the drawing). A touch sensor may be arranged over the counter substrate 124 or between the light-emitting elements 180 and the counter substrate 124.

3. Suppression of Property Deterioration

As described in the First Embodiment, when the light-emitting element 180 emits light, that is, when a current flows in the channel of the first semiconductor film 174, the AC stress deterioration becomes remarkable at the edge portion of the second electrode 144a serving as a drain electrode. Therefore, the second gate insulating film 164 is prepared so that the thickness $t_2$ thereof is larger than the thickness $t_1$ of the first gate insulating film 148 in the display device 120. Although the first gate electrode 172 and the second gate electrode 178 are applied with the same potential, this structure enables the electric field between the second electrode 144a and the second gate electrode 178 to be relaxed, thereby suppressing the AC stress deterioration at the edge portion of the second electrode 144a. Accordingly, the properties of the transistor 170 are stabilized, which contributes to improvement of reliability of the display device 120.

4. Modified Example

Figure 7:
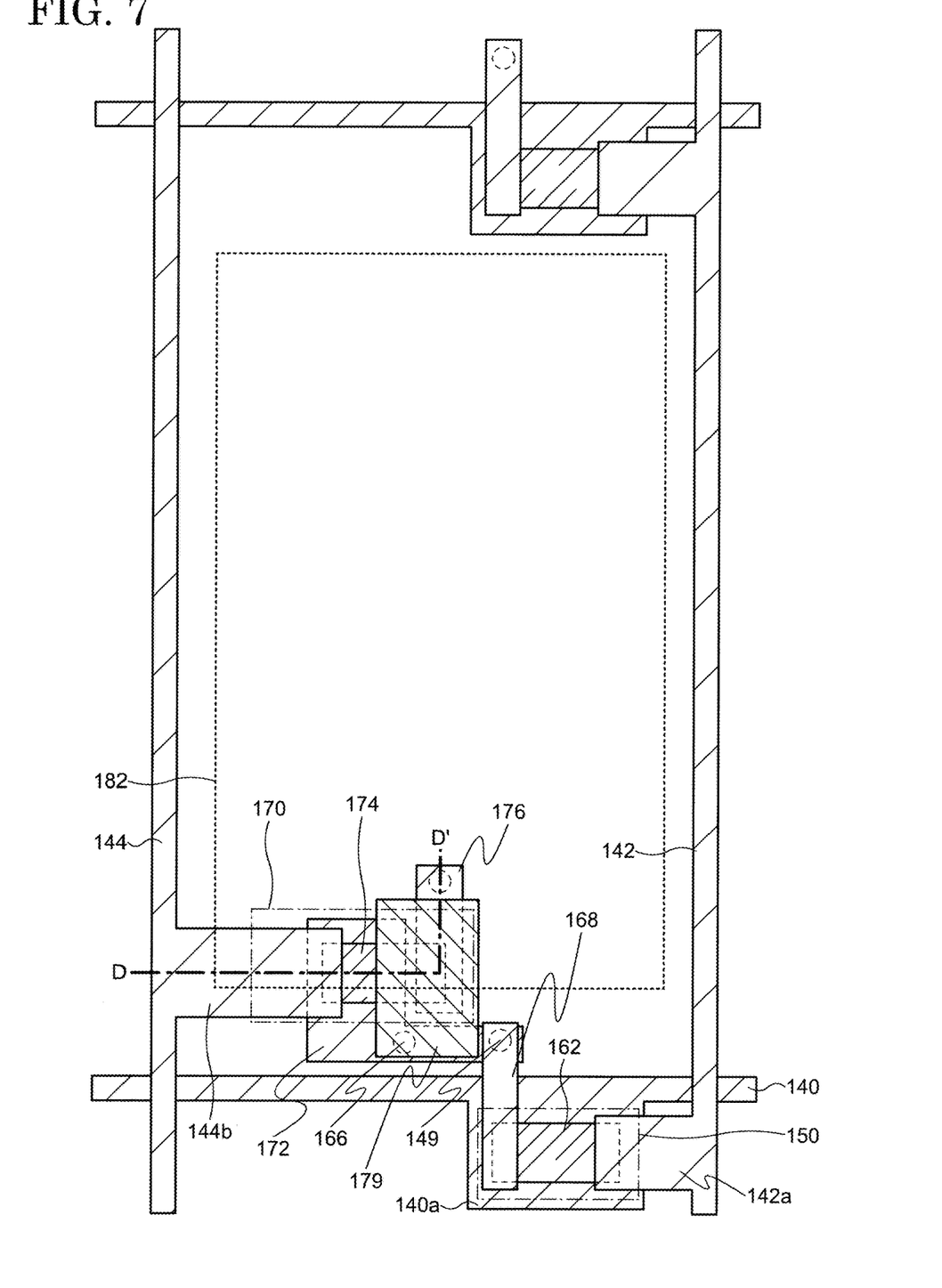
FIG. 7 is a schematic top view of a pixel of a display device according to an embodiment of the present invention.
Figure 8:
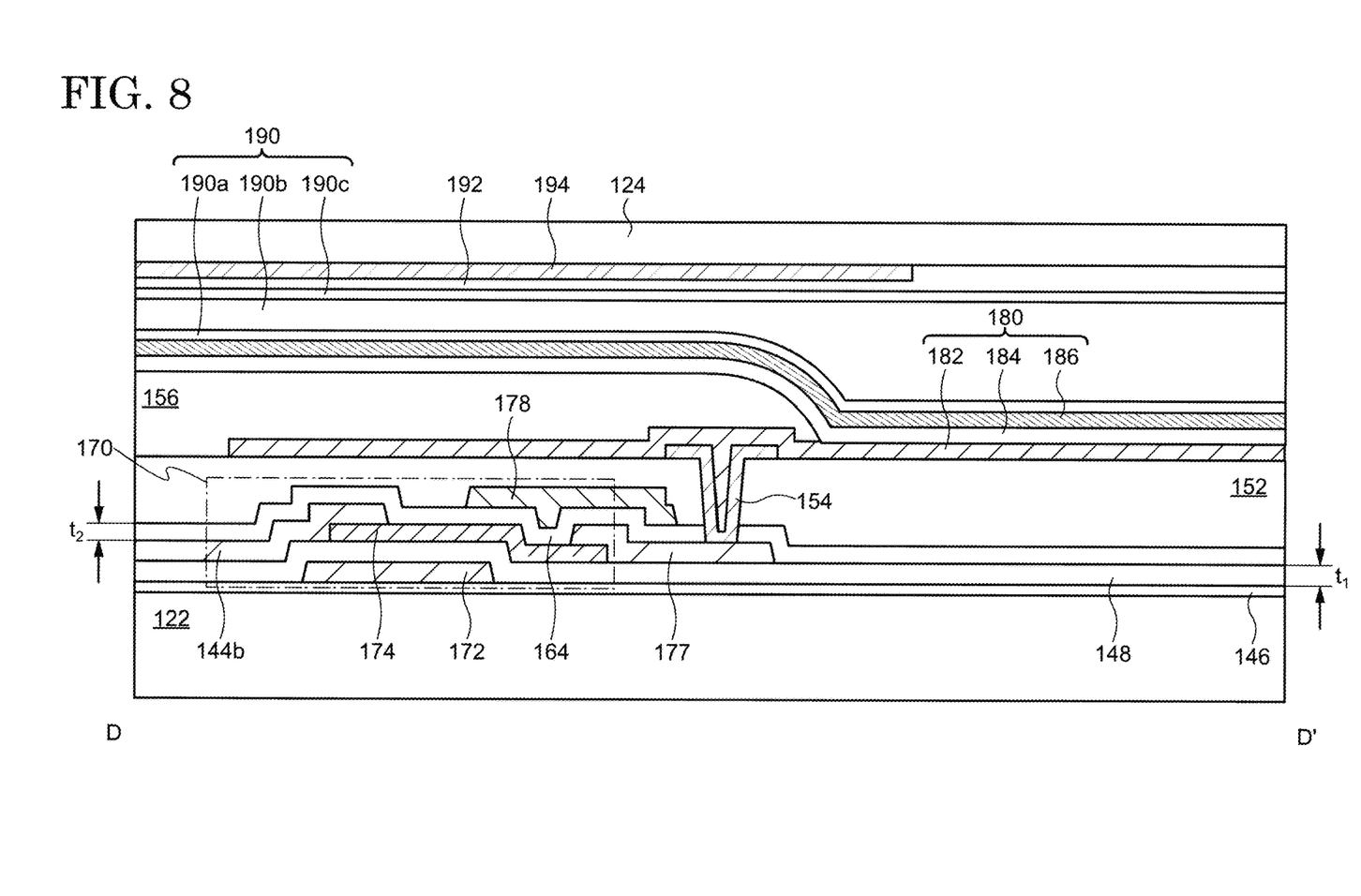
FIG. 8 is a schematic cross-sectional view of a display device according to an embodiment of the present invention.

The structure of the pixel circuit of the display device 120 is not limited to that described above. A modified example is demonstrated in FIG. 7 and FIG. 8. FIG. 7 is a schematic top view of a pixel of the modified example, and FIG. 8 is a schematic view of a cross section along a dotted line D-D' in FIG. 7.

In this modified example, the transistor 170 has a first gate electrode 172, a first gate insulating film 148 covering the first gate electrode 172, and a first semiconductor film 174 overlapping with the first gate electrode 172 through the first gate insulating film 148. The transistor 170 further includes a first electrode 144b and a second electrode 177 which are located over, in contact with, and overlap with the first gate insulating film 148 and the first semiconductor film 174. A part of the first electrode 144b may overlap with the first gate electrode 172. Note that the first electrode 144b is a part of the current supplying line 144 and is illustrated in the drawing as a portion protruding rightward from the current-supplying line 144.

The transistor 170 further includes a second gate insulating film 164 located over the first electrode 144b and the second electrode 177 and covering at least a part thereof. In this modified example, the second gate insulating film 164 is prepared so that a thickness $t_2$ thereof is smaller than a thickness $t_1$ of the first gate insulating film 148. The transistor 170 further includes a second gate electrode 178 over and in contact with the second gate insulating film 164. The second gate electrode 178 is provided so as to cover a part of the first gate electrode 172, a part of the first semiconductor film 174, and at least a part of the second electrode 177. Hence, a part of the first electrode 172 and a part of the first semiconductor film 174 are each exposed from the second gate electrode 178. On the other hand, the second gate electrode 178 does not overlap with the first electrode 144b. That is, the whole of the first electrode 144b is exposed from the second gate electrode 178.

The first gate electrode 172, the first gate insulating film 148, the first semiconductor film 174, the first electrode 144b, the second electrode 177, the second gate insulating film 164, and the second gate electrode 178 respectively correspond to the first gate electrode 104, the first gate insulating film 106, the semiconductor film 112, the first electrode 108, the second electrode 110, the second gate insulating film 116, and the second gate electrode 114 of the semiconductor device 100 demonstrated in FIG. 2B. Hence, the arrangement with respect to the first gate electrode 172, the first gate insulating film 148, the first semiconductor film 174, the first electrode 144b, the second electrode 177, the second gate insulating film 164, and the second gate electrode 178 is the same as that of the semiconductor device 100. Since the elements arranged over the leveling film 152 are the same as those described above, an explanation thereof is omitted.

As described above, the display device 120 is structured in this modified example so that the thickness $t_1$ of the first gate insulating film 148 is larger than the thickness $t_2$ of the second gate insulating film 164. Therefore, although the same potential is applied to the first gate electrode 172 and the second gate electrode 178, the electric field between the first electrode 144b serving as a drain electrode and the first gate electrode 172 is relaxed, and the AC stress deterioration at the edge portion of the first electrode 144b is suppressed. Accordingly, the properties of the transistor 170 are stabilized, which contributes to the reliability of the display device 120.

Although a detailed explanation is omitted, the display device 120 may be also configured so that the first gate electrode 172 and the second gate electrode 178 of the transistor 170 are provided with different potentials. In this case, the thickness $t_1$ of the first insulating film 148 may be the same as the thickness $t_2$ of the second gate insulating film 164.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is understood that another effect different from that provided by each of the aforementioned embodiments is achieved by the present invention if the effect is obvious from the description in the specification or readily conceived by persons ordinarily skilled in the art.

What is claimed is:

1. A semiconductor device comprising:
a first gate electrode;
a first gate insulating film over the first gate electrode;
a semiconductor film over the first gate insulating film and overlapping with the first gate electrode;
a first electrode and a second electrode each over and in contact with the semiconductor film;
a second gate insulating film over the first electrode and the second electrode; and
a second gate electrode located over the second gate insulating film and overlapping with the second electrode and the first gate electrode,
wherein
the semiconductor film includes a first part, a second part, and a third part,
the first part overlaps with the first electrode,
the second part overlaps with the second electrode,
the third part is between the first part and the second part in a planar view and does not overlap with either the first electrode or the second electrode,
the third part includes a first region, a second region, and a third region,
the first region overlaps with the first gate electrode and does not overlap with the second gate electrode,
the second region is sandwiched by the first gate electrode and the second gate electrode, and
the third region overlaps with the second gate electrode and does not overlap with the first gate electrode.

2. The semiconductor device according to claim 1,
wherein
the first gate electrode overlaps with a part of the first electrode and does not overlap with a part of the second electrode, and
the second gate electrode overlaps with the part of the second electrode and does not overlap with the part of the first electrode.

3. The semiconductor device according to claim 1,
wherein the semiconductor film includes an oxide semiconductor.

4. The semiconductor device according to claim 1,
wherein the first gate electrode and the second gate electrode are configured to be respectively supplied with potentials different from each other.

5. The semiconductor device according to claim 4,
wherein a thickness of the first gate insulating film and a thickness of the second gate insulating film are substantially the same as each other.

6. The semiconductor device according to claim 1,
wherein a thickness of the second gate insulating film is larger than a thickness of the first gate insulating film.

7. The semiconductor device according to claim 6,
wherein the first electrode and the second electrode are respectively a source electrode and a drain electrode.

8. The semiconductor device according to claim 1,
wherein a thickness of the first gate insulating film is larger than a thickness of the second gate insulating film.

9. The semiconductor device according to claim 8,
wherein the first electrode and the second electrode are respectively a drain electrode and a source electrode.

10. A display device comprising a pixel including:
a light-emitting element; and
a first transistor electrically connected to the light-emitting element, the first transistor comprising:
a first gate electrode;
a first gate insulating film over the first gate electrode;
a first semiconductor film located over the first gate insulating film and overlapping with the first gate electrode;
a first electrode and a second electrode each over and in contact with the first semiconductor film;
a second gate insulating film over the first electrode and the second electrode; and
a second gate electrode located over the second gate insulating film and overlapping with the second electrode and the first gate electrode, wherein
the semiconductor film includes a first part, a second part, and a third part,
the first part overlaps with the first electrode,
the second part overlaps with the second electrode,
the third part is between the first part and the second part in a planar view, and does not overlap with either the first electrode or the second electrode,
the third part includes a first region, a second region, and a third region,
the first region overlaps with the first gate electrode and does not overlap with the second gate electrode,
the second region is sandwiched by the first gate electrode and the second gate electrode, and
the third region overlaps with the second gate electrode and does not overlap with the first gate electrode.

11. The display device according to claim 10,
wherein
the first gate electrode overlaps with a part of the first electrode and does not overlap with a part of the second electrode, and
the second gate electrode overlaps with the part of the second electrode and does not overlap with the part of the first electrode.

12. The display device according to claim 10,
wherein the first semiconductor film includes an oxide semiconductor.

13. The display device according to claim 10,
wherein the first gate electrode and the second gate electrode are configured to be respectively supplied with potentials different from each other.

14. The display device according to claim 13,
wherein a thickness of the first gate insulating film and a thickness of the second gate insulating film are substantially the same as each other.

15. The display device according to claim 10,
wherein a thickness of the second gate insulating film is larger than a thickness of the first gate insulating film.

16. The display device according to claim 15,
wherein the first transistor is electrically connected to the light-emitting element through the first electrode.

17. The display device according to claim 10,
wherein a thickness of the first gate insulating film is larger than a thickness of the second gate insulating film.

18. The display device according to claim 17,
wherein the first transistor is electrically connected to the light-emitting element through the second electrode.

19. The display device according to claim 10,
wherein the pixel further comprises a second transistor electrically connected to the first gate electrode of the first transistor.

20. The display device according to claim 19,
wherein the second transistor has a second semiconductor film containing silicon.

* * * * *